(12) United States Patent
Min et al.

(10) Patent No.: US 6,617,843 B2
(45) Date of Patent: Sep. 9, 2003

(54) CONTACTOR OF THE DEVICE FOR TESTING SEMICONDUCTOR DEVICE

(75) Inventors: Kyung-Jo Min, Suwon (KR); Kyung-Tae Kim, Suwon (KR); Ung-Hyun Yoo, Suwon (KR)

(73) Assignee: Techwing Co., Ltd., Hwasung-si (KR)

( * ) Notice: Subject to any disclaimer, the term of this patent is extended or adjusted under 35 U.S.C. 154(b) by 0 days.

(21) Appl. No.: 09/946,676

(22) Filed: Sep. 6, 2001

(65) Prior Publication Data

US 2002/0093352 A1 Jul. 18, 2002

(30) Foreign Application Priority Data

Jan. 15, 2001 (KR) .......................... 2001-2108
Aug. 2, 2001 (KR) ......................... 2001-46736

(51) Int. Cl.$^7$ ............................................. G01R 31/02
(52) U.S. Cl. ..................................... 324/158.1; 324/760
(58) Field of Search ................................ 324/754, 760, 324/765, 158.1; 165/80.2, 80.3; 361/678, 690, 691, 692, 693, 694, 695, 696

(56) References Cited

U.S. PATENT DOCUMENTS

| | | | | |
|---|---|---|---|---|
| 3,039,604 A | * | 6/1962 | Bickel et al. ............... | 209/556 |
| 3,179,248 A | * | 4/1965 | Manley ....................... | 209/574 |
| 4,870,355 A | * | 9/1989 | Kufis et al. ................. | 324/760 |
| 5,065,089 A | * | 11/1991 | Rich ........................... | 324/760 |
| 5,436,569 A | * | 7/1995 | Melgaard et al. ........... | 324/760 |
| 5,691,650 A | * | 11/1997 | Sugai ......................... | 324/755 |
| 5,872,458 A | * | 2/1999 | Bordman et al. ........... | 324/758 |
| 6,163,145 A | * | 12/2000 | Yamada et al. .......... | 324/158.1 |
| 6,268,740 B1 | * | 7/2001 | Iida ............................. | 324/765 |
| 6,304,093 B1 | * | 10/2001 | Hilmoe et al. .............. | 324/760 |

\* cited by examiner

Primary Examiner—Ernest Karlsen
(74) Attorney, Agent, or Firm—Robert E. Bushnell, Esq.

(57) ABSTRACT

The present invention discloses a contactor of the device for testing a semiconductor device comprising a fixed block receiving a test tray having a plurality of a semiconductor device, a base plate having a cylinder on one side of the base plate and installed in one side of the fixed block, a push plate moving forward and backward by the cylinder and installed between the base plate and the fixed block, a plurality of an air nozzle to be contacted to the test tray by a forward and backward movement of the push plate having the cylinder, and installed in the push plate and protruded to the test tray, and a providing means of blending air to guide and provide the blending air for the air nozzle.

27 Claims, 7 Drawing Sheets

CONTACTOR OF THE DEVICE FOR TESTING SEMICONDUCTOR DEVICE

CLAIM OF PRIORITY

This application makes reference to, incorporates the same herein, and claims all benefits accruing under 35 U.S.C. §119 from my application entitled CONTACTOR OF TESTING DEVICE FOR SEMICONDUCTOR ELEMENT filed with the Korean Industrial Property Office on Jan. 15, 2001 and there duly assigned Serial No. 2001-2108 and my application entitled CONTACTOR OF THE DEVICE FOR TESTING SEMICONDUCTOR ELEMENT filed with the Korean Industrial Property Office on Aug. 2, 2001 and there duly assigned Serial No. 2001-46736.

BACKGROUND OF THE INVENTION

1. Field of the Invention

The present invention relates to a contactor of the device for testing a semiconductor device.

2. Description of Related Art

Generally, in order to test a semiconductor device, an electric property, a functional property, and an operation speed, etc., of a packaged product are examined with performing test program constructed by a computer. Then, according to an examine result, it is determined whether the semiconductor device has defectives or not. The test of the semiconductor device comprises a collection and analysis of an examine data, and total works to improve properties and yield of the product by feeding-back the results of the collection and analysis of the examine data to the engineer.

As shown in FIG. 1, such a test device for the semiconductor device comprises a user tray (10), a stacker (11), a pick-up robot (12), a test tray (13), a tester (14), and monitor (15). An operation method of the test device is as follows. When a plurality of the user tray (10) are charged into the stacker (11), the pick-up robot (12) picks up the respective semiconductor device and rests it on the test tray (13). Then, the semiconductor device transferred by other transfer means is connected to the tester (14), a program already set examines the semiconductor device, and an examine data is outputted by the computer and is displayed on a monitor (15).

At this time, in order to provide a test condition, the test device has apparatus supplying a heat or cold air for the trays (10, 13).

The test device of the semiconductor device providing test conditions comprises a duct, a blow fan, a heater and a cooling tube. The duct having an input and an output entrances flows air, the blow fan can inhale and discharge an outer air into the duct or to the outside, and the heater and the cooling tube are installed in an input entrance of the blow fan and heat or cool an inhalated air.

Because the semiconductor device for the test is positioned on the duct together with the trays, the semiconductor device is indirectly heated by air inputted or outputted through the duct and the temperature condition of the test for the semiconductor device becomes fixed.

However, if the semiconductor device is indirectly heated or cooled, it takes too much time to fix the temperature condition for the test and it is difficult to maintain stable and constant the temperature condition. Accordingly, there occur problems with a usage efficiency and an operational reliability of the test device.

SUMMARY OF THE INVENTION

To overcome the problems described above, preferred embodiments of the present invention provide a contactor that can maintain and control a test temperature with high reliability by directly supplying a heating or cooling air for a semiconductor device.

In order to achieve the above object, a preferred embodiment of the present invention provides a contactor comprising a fixed block receiving a test tray having a plurality of a semiconductor device, a base plate having a cylinder on one side of the base plate and installed in one side of the fixed block, and a providing means of blending air to guide and provide the blending air for the air nozzle.

The preferred embodiment of the present invention further provides the contactor further comprising a plurality of an air nozzle contacted with the test tray and installed between the base plate and the fixed block.

The preferred embodiment of the present invention further provides the contactor further comprising a push plate moving forward and backward by the cylinder and installed between the base plate and the fixed block.

The preferred embodiment of the present invention further provides the contactor further comprising the providing means of blending air including an air duct installed between the push plate and the base plate, and a plurality of a communication vessel in an inner portion of the air duct, protruded to the air nozzle and entering into the air nozzle, and having an entrance to flow the blending air into the communication vessel.

The present embodiment of the present invention further provides the contactor comprising the air duct including a penetration hole penetrating a cylinder rod extended from the cylinder.

The present embodiment of the present invention further provides the contactor further comprising a plurality of guide axis penetrating the push plate and being between the base plate and the fixed block.

The present embodiment of the present invention further provides the contactor further comprising position determining pins to determine a position of the push plate at an opposite portion against the fixed block of the push plate when the push plate is operated toward the test tray.

The present embodiment of the present invention further provides the contactor comprising the air nozzle including an outer tube penetrating and being combined with the push plate and opening a lower and an upper portion of the outer tube, a nozzle tube opening a lower and an upper portion of the nozzle tube, a part of the nozzle installed in an inner portion of the outer tube, and a spring installed in the inner of the outer tube, one side of the spring supported by an inner and lower portion of the outer tube, and other side of the spring supported by a circumference of the nozzle to be able to be flexible in the outer tube.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Reference will now be made in detail to a preferred embodiment of the present invention, example of which is illustrated in the accompanying drawings.

Figure 1:
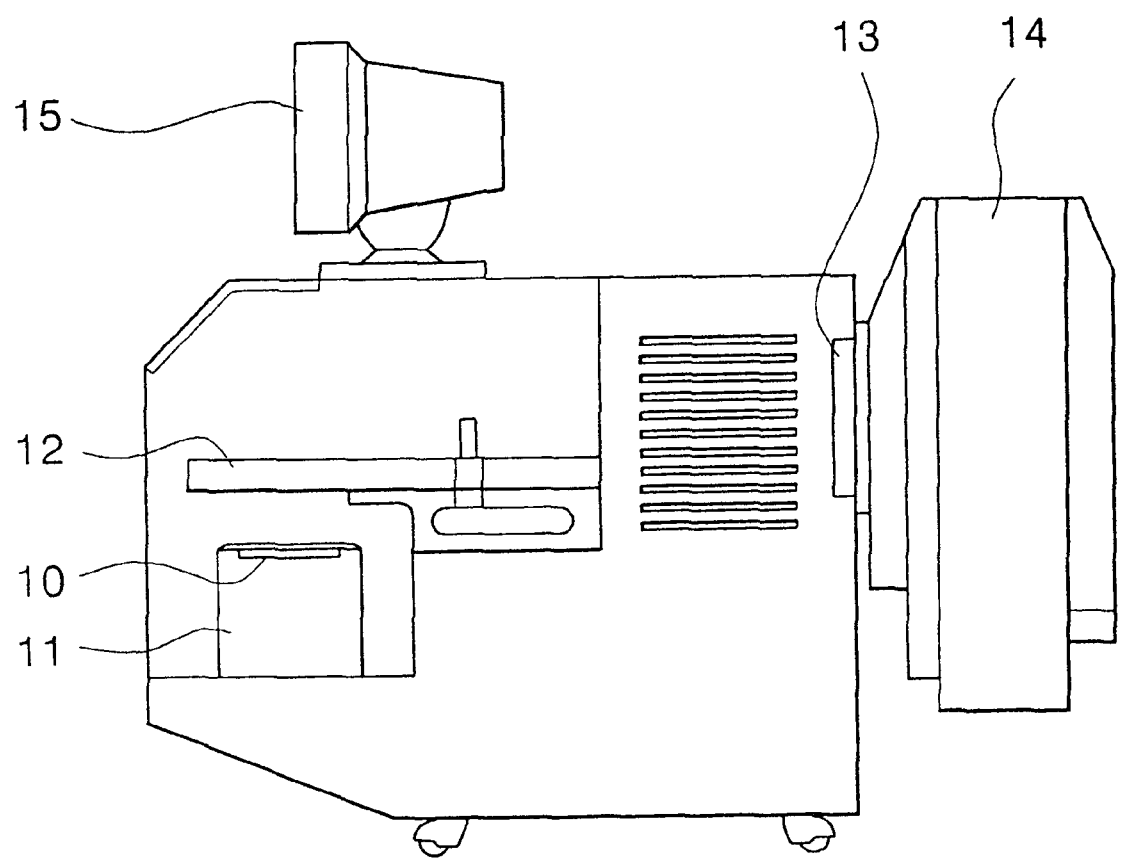
FIG. 1 shows a sketch view of a test device for semiconductor devices.
Figure 2:
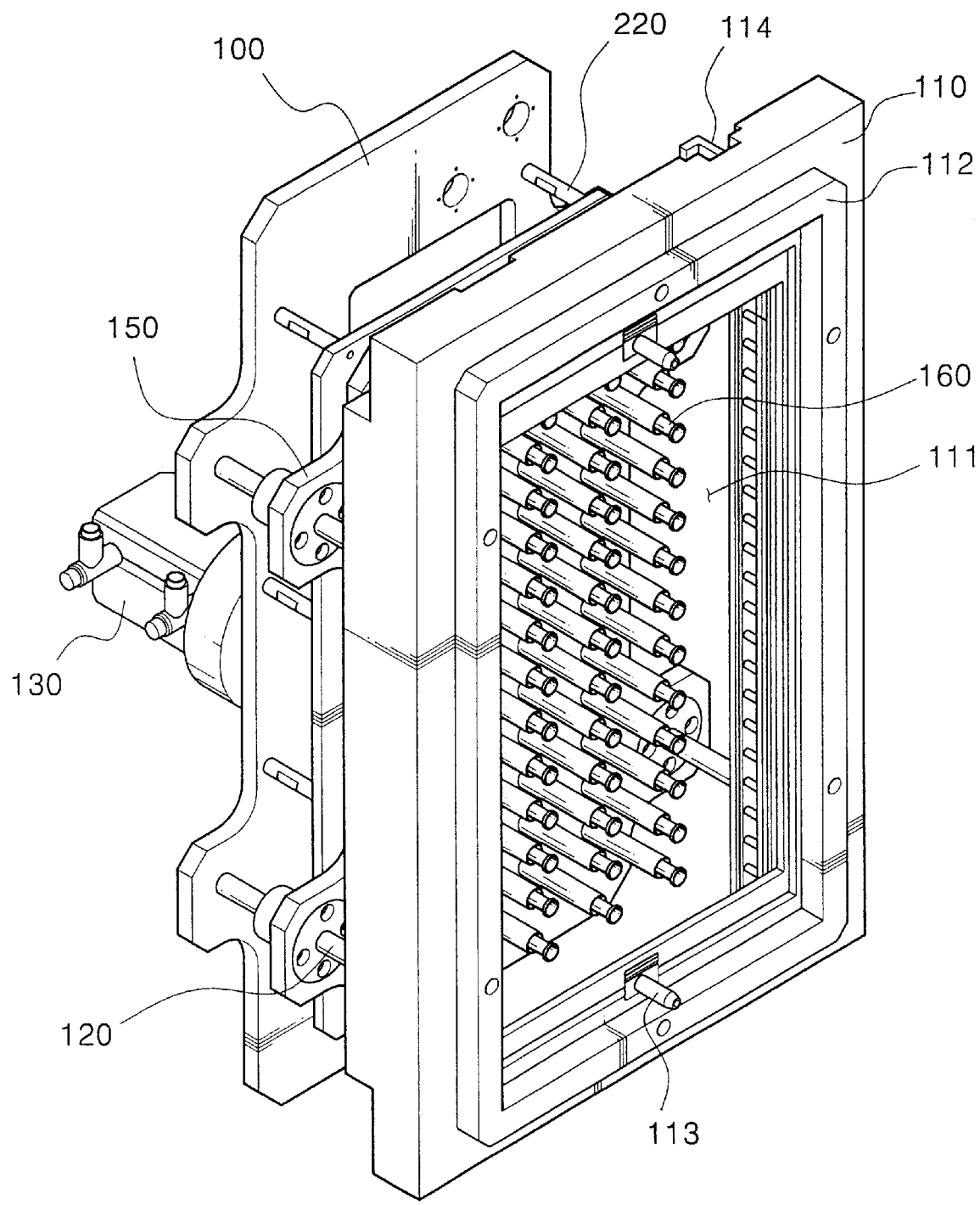
FIG. 2 shows a perspective view of a contactor of the test device for semiconductor devices according to a preferred embodiment of a present invention.
Figure 3:
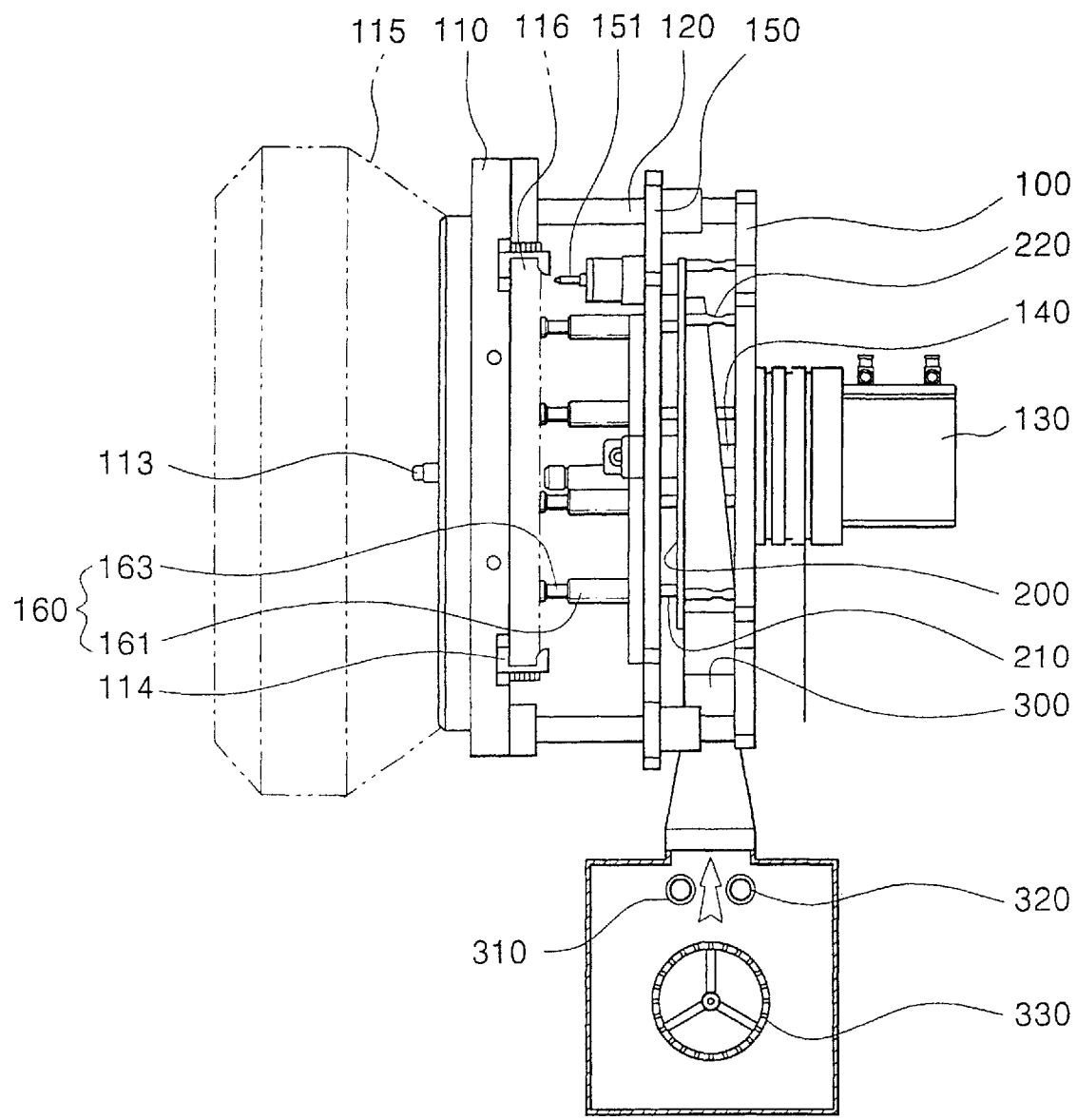
FIG. 3 shows a side view of the contactor of the test device for the semiconductor devices according to the preferred embodiment of the present invention.

As shown in FIGS. 2 and 3, a contactor of the test devices for a semiconductor devices has a base plate of a square plate type (100) and a fixed block (110) spaced apart from and parallelly disposed with the base plate (100). The fixed block (110) includes an open portion (111) opening a front portion and is electrically connected to a tester (115) for testing the semiconductor device at one side of the fixed block (110).

An up and down portion of the fixed block (110) for combining the tester (115) with the fixed block (110) has a combining portion (112) and a guide pin (113) is protruded for guiding a position of the tester (115) at both end portions of the combining portion (112). Also, a receiving groove (114) for receiving a test tray (116) is formed at a bottom portion of the fixed block (110).

Four guide axes (120) are installed between the fixed block (110) and four corners of the base plate (100), and a cylinder(130) is equipped in a centric outer direction of the base plate (100). A cylinder rod (140) is installed to move forward and backward by an operation of the cylinder (130), and the cylinder rod (140) penetrates into a duct plate (200) and is extended to the fixed block (110).

A push plate (150) is installed between the base plate (100) and the fixed block (110). The push plate (150) is supported by a guide pin (120) penetrating an edge portion of the push plate (150).

Figure 4:
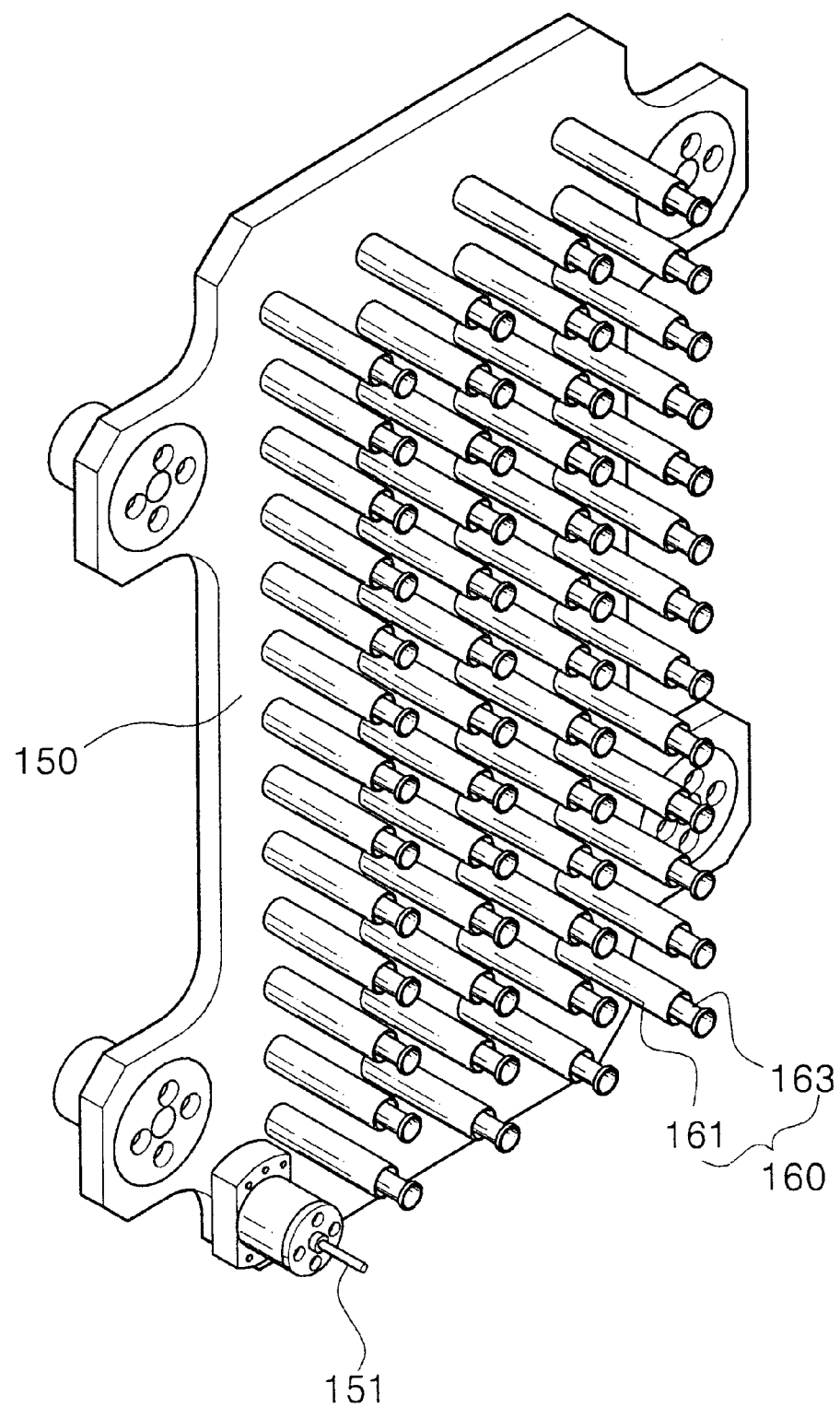
FIG. 4 shows a perspective view of a push plate having an air nozzle of the contactor of the test device for the semiconductor devices according to the preferred embodiment of the present invention.
Figure 6:
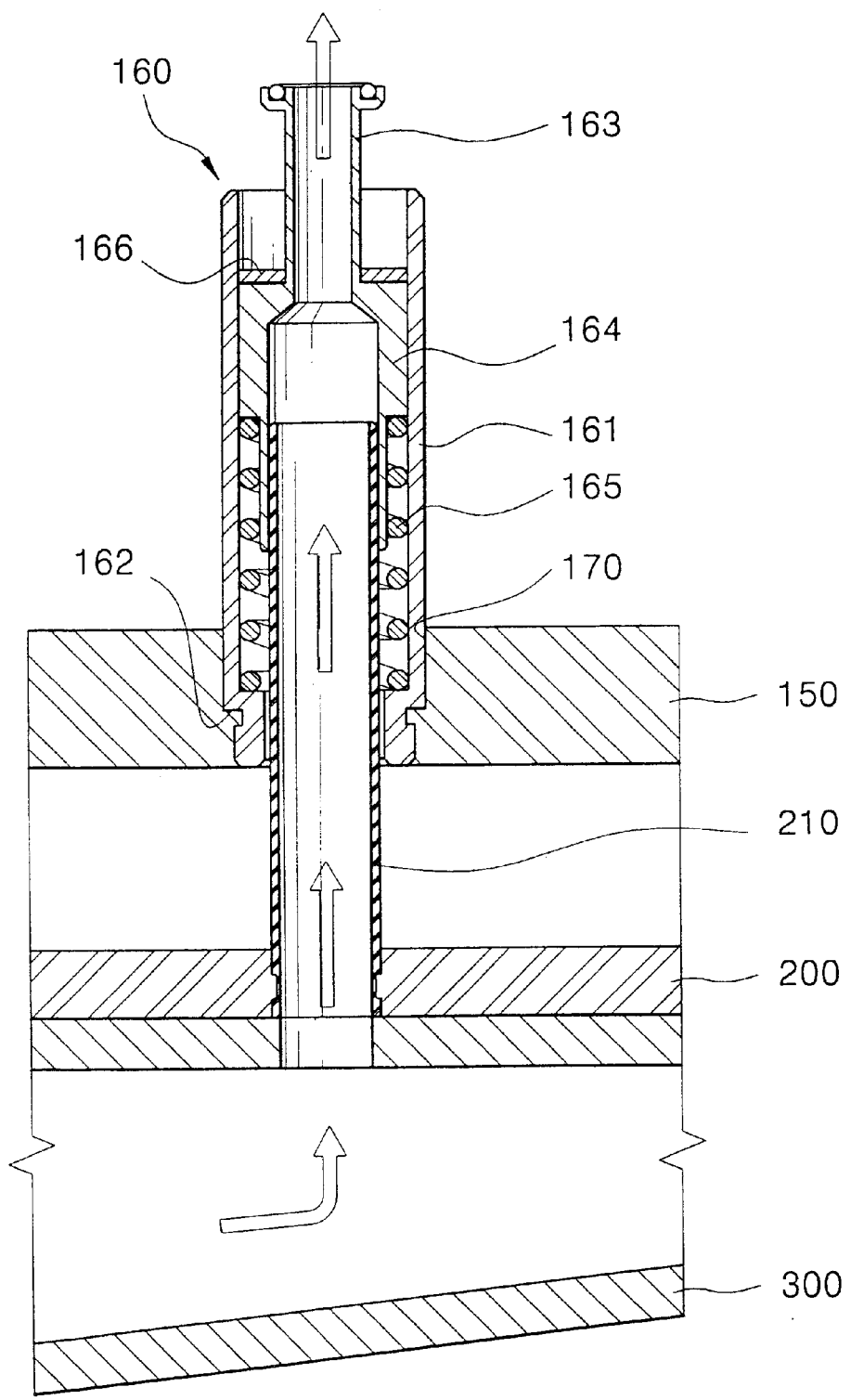
FIG. 6 shows a cross-sectional view of an install state of the air nozzle installed in the contactor of the test device for semiconductor devices according to the preferred embodiment of the present invention.

Also, as shown in FIGS. 4 and 6, a plurality of air nozzles (160) are installed at a side portion of the push plate (150) directing to the fixed block (110). The air nozzle (160) penetrates the push plate (150) up and down and is installed, penetrating holes (170) are formed as same as the number of the air nozzle (160) at the push plate (150) for installing the air nozzle.

Figure 7:
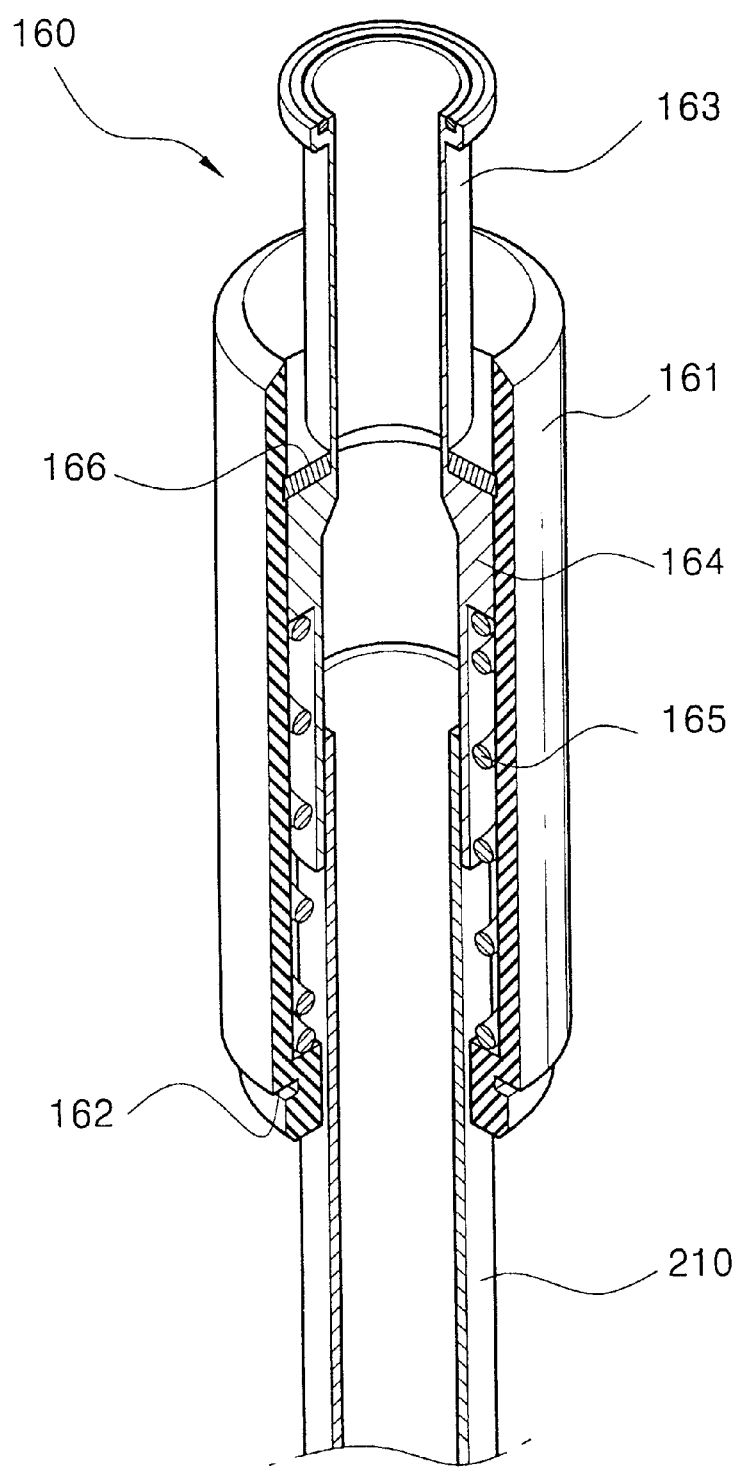
FIG. 7 shows a perspective view of a part of a configuration of the air nozzle installed in the contactor of the test devices for the semiconductor devices according to the preferred embodiment of the present invention.

As shown in FIGS. 6 and 7, the air nozzle (160) includes an outer tube (161) inserting into a penetrating hole (170) of the push plate (150) to a bottom portion of the outer tube, and a nozzle tube (163) inserted into an inner portion of the outer tube (161) to be slided up and down in the inner portion of the outer tube (161). Part of an up and down portion of the nozzle tube is protruded and extended.

A protrusion side (164) is formed to be protruded stepped pulley in a predetermined width in order to bound part of outer circumference of the nozzle tube (163) with an inner diameter of the outer tube (161) in the nozzle tube (163).

A spring (165) is installed in the inner portion of the outer tube (161). One side of the spring (165) is supported by a bottom portion of the protrusion side (164) of the nozzle tube (163), the other side of the spring (165) is supported by a bottom portion of the inner portion of the nozzle (160), and elastically supports the nozzle tube (163) toward a front direction. And, a supporting ring (166) is installed to restrict a front protrusion position of the nozzle tube (163) on an upper portion of the inner portion of the outer tube (161).

A position determining pin (151) is installed to determine a position of the test tray (116) in the push plate (150). Although not shown, the position determining pin (151) can have a spring in the inner portion of the pin (151) and can be installed to have a predetermined elastic force.

Figure 5:
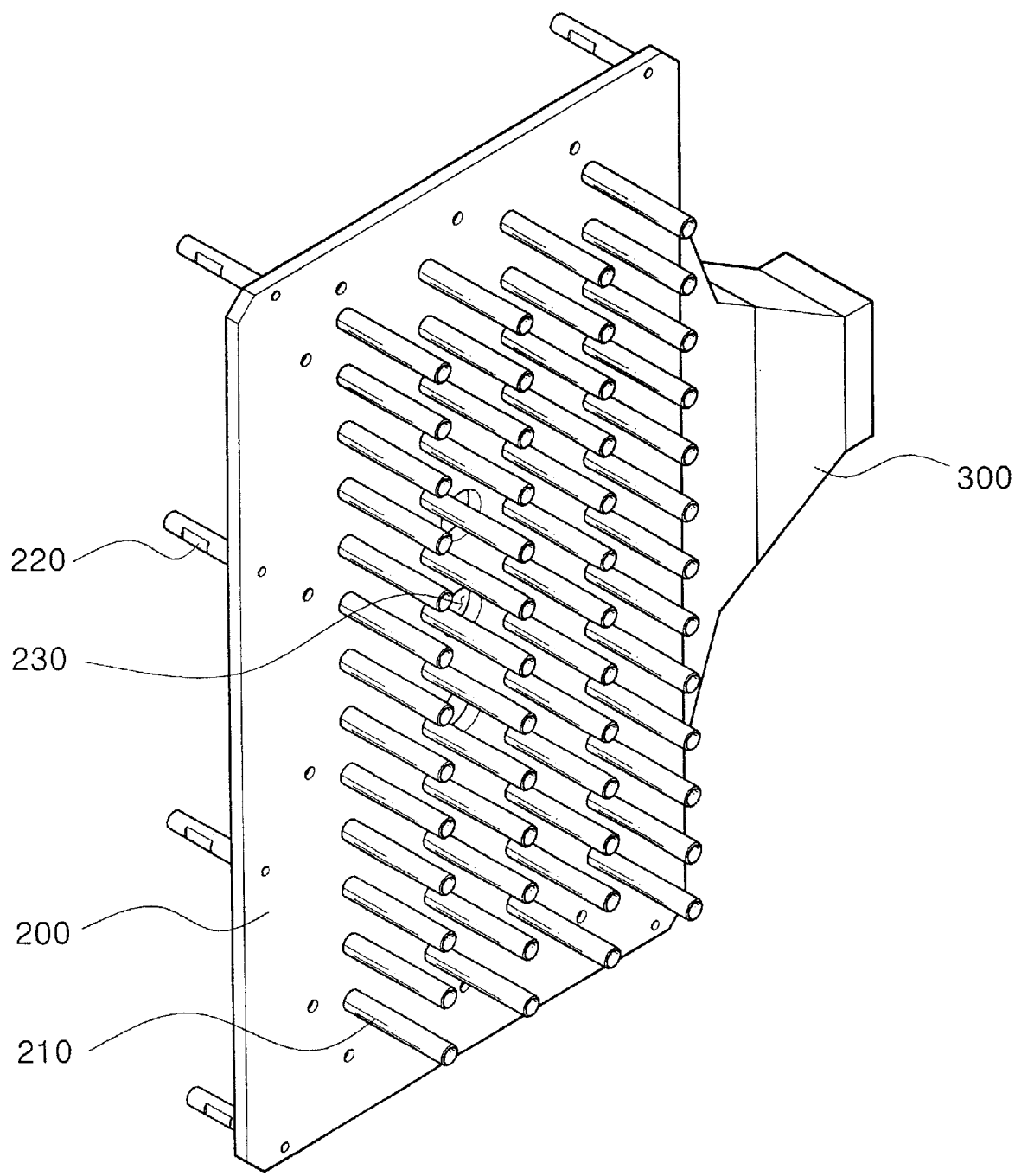
FIG. 5 shows a perspective view of a duct plate installed in the contactor of the test devices for the semiconductor devices according to the preferred embodiment of the present invention.

A duct plate (200) combined with an air duct (300) at a back side is positioned at a back side of the push plate (150). And, as shown in FIG. 5, the duct plate (200) is combined with a plurality of a communication vessel (210). An upper and down portion of the communication vessel (210) is inserted into an inner portion of the outer tube of the air nozzle (160). The communication vessel (210) penetrates the duct plate (200) and is installed to provide an air inflow through the air duct (300) for the air nozzle (160).

Also, a part of an edge portion of the communication vessel (210) is inserted into an inner portion of the nozzle tube (163) from an inner portion of the outer tube (161). That is, a size of the communication vessel (210) is smaller than the outer tube (161) and nozzle tube (163), and an inserting depth of the communication vessel is a degree to maintain a inserting state in the inner of the nozzle (163) in an up and down operating stroke of the nozzle (163). An end portion (162) of the air nozzle (160) is inside the push plate (150).

A fixed bar (220) extended to the base plate (100) is established in the back side of the duct plate (200), and fixes and establishes the duct plate (200) in the base plate (100). A penetrating hole (230) is formed to be penetrated by the cylinder rod (140) in the center of the duct plate (200).

A blending air providing apparatus (air providing unit) has a heater (310) and a cooling tube (320) in an inner portion of the apparatus, and is installed to blow the blending air by a blow fan (330) in order to provide the blending air of an exterior for the air duct (300).

Hereinafter, an operation of the contactor of the test device for the semiconductor devices according to a preferred embodiment of the present invention is as follows.

In the test device for the semiconductor device of the present invention, when the test tray (116) fitting a plurality of the semiconductor device by means of a transfer means, for example, escalator, is received in the inner portion of a receiving groove (114) formed at one side of the fixed block (110), the push plate (150) moves forward, and simultaneously the tester (115) is guided by the guide pin (113) from the exterior and is combined with the combining portion (112). Accordingly, the semiconductor device received in the test tray (116) is connected to the tester (115).

The push plate (150) is guided inline with the guide axis (120) by a driving force loaded by the cylinder rod (140) moving forward according to an operation of the cylinder (130) and moves forward.

Then, the push plate (150) moves forward and together the air nozzle (160) fitted in one side of the push plate (150) moves forward. Subsequently, an up and down portion of the nozzle tube (163) of the air nozzle (160) is contacted with the test tray(1 16) having the semiconductor device being in the test tray (116).

And, the communication vessel (210) can not be left from the outer tube (161) and the nozzle tube (163), and a heating wind or a cooling wind can be directly provided for the test device because the inserting depth of the communication vessel (210) is deeper than a forward and backward stroke of the push plate (150) when the nozzle tube (163) is operated at the above cited state.

Also, a contact point of the test tray (116) and the nozzle tube (163) of the air nozzle (160) and a test position of the test tray (116) is rightly fitted at the right position because the position determining pin formed in the one side of the push plate (150) rightly guides the contact position with the test tray (116) due to the forward movement of the push plate (150).

When the blending air heated or cooled from an entrance of the air duct (300) at this state is supplied by the blow fan (330), the blending air is provided for the respective communication vessel (210) installed in the duct plate (200) along the air duct (300).

The blending air provided for the respective communication vessel (210) is continuously discharged and provided directly for the test tray (116) through the nozzle tube (163). Accordingly, a test condition of the semiconductor device is satisfied with the uniform heating or cooling of the semiconductor in the moderate temperature for the test.

When the test of the semiconductor device is completed by the cited above operation, the cylinder rod (140) moves backward and the push plate (150) simultaneously moves backward. Then, the tester (115) is separated from the fixed block (110) and the test tray (116) is simultaneously separated from the fixed block (110). Hereinafter, other test tray (116) is inserted and the test of the semiconductor device is continuously performed.

As described herein before, because the contactor of the test device for the semiconductor device according to the preferred embodiment of the present invention can directly provide heating or cooling air for the semiconductor device, the temperature of the test can be maintained and controlled with high operation reliance. Also, because the nozzle installed to provide heating or cooling air directly for the test tray is elasticized by elastic force, the contact stability of the nozzle, the test tray and the tester can be maintained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An apparatus for testing devices, comprising:
   a fixed block receiving a test tray having at least one device;
   a tester being positioned at a first side of said fixed block, said tester testing the at least one device when the test tray is received by said fixed block;
   a base plate being coupled to said fixed block and being positioned at a second side of said fixed block;
   a push plate being movably mounted on guide pins located between said base plate and the second side of said fixed block, said push plate being moved toward the test tray and away from the test tray along the guide pins; and
   at least one air nozzle being mounted on said push plate, said at least one air nozzle guiding air directly toward at least one selected from among the test tray and the at least one device when said push plate is moved toward the test tray, the air being guided to control an environment of the at least one device, said at least one air nozzle comprising:
      an outer tube being mounted to said push plate, said outer tube forming an opening facing toward the test tray, the air flowing through said outer tube; and
      a nozzle tube, said nozzle tube penetrating the opening formed by said outer tube, said nozzle tube being partly outside said outer tube and being partly inside said outer tube, the air flowing through said nozzle tube, said nozzle tube being supported by an elastic force pushing said nozzle tube away from said push plate.

2. The apparatus of claim 1, said nozzle tube extending a first distance out away from the opening formed by said outer tube when said nozzle tube is not contacting the at least one device and is not contacting the test tray, said nozzle tube extending less than the first distance out away from the opening formed by said outer tube when said nozzle tube is contacting at least one selected from among the test tray and the at least one device.

3. The apparatus of claim 2, further comprising:
   a movable unit being coupled to said base plate, said push plate being moved toward and away from the test tray along the guide pins by said movable unit.

4. The apparatus of claim 3, said movable unit corresponding to a cylinder.

5. The apparatus of claim 3, further comprising:
   an air providing unit providing air to the at least one device through the at least one air nozzle, said air providing unit comprising:
      an air duct being installed between said push plate and said base plate; and
      at least one communication vessel protruding from said air duct, said at least one vessel guiding air from said air providing unit to said at least one air nozzle and extending into said at least one air nozzle.

6. The apparatus of claim 5, said air providing unit heating and cooling air, blending the heated and cooled air, and providing the blended air to said at least one air nozzle.

7. The apparatus of claim 5, the guide pins penetrating said push plate.

8. The apparatus of claim 5, said air duct forming a penetration hole penetrated by a rod extending from said movable unit, the rod moving toward said fixed block and away from said fixed block to move said push plate along the guide pins.

9. The apparatus of claim 5, further comprising at least one position determining pin mounted on said push plate on a side of said push plate facing toward said fixed block, said at least one position determining pin aligning said push plate with the test tray when said push plate is moved toward the test tray by said movable unit.

10. The apparatus of claim 2, said at least one air nozzle further comprising:
    a spring being installed inside said outer tube, said spring providing the elastic force pushing said nozzle tube, said nozzle tube being movably mounted inside said outer tube.

11. The apparatus of claim 10, said outer tube having a support ring near the opening formed by said outer tube, the support ring stopping said nozzle tube from being pushed out of said outer tube by said spring.

12. The apparatus of claim 10, said at least one vessel extending into said outer tube and into said nozzle tube.

13. An apparatus for testing devices, comprising:
    a fixed block receiving a test tray having a plurality of devices;

a tester being positioned at a first side of said fixed block, said tester testing the devices when the test tray is received by said fixed block;

a base plate being coupled to said fixed block and being located at a second side of said fixed block;

a movable unit being mounted to said base plate and having a rod;

a push plate being positioned between said fixed block and said base plate, said push plate being moved toward and away from said fixed block by the rod;

an air providing unit providing air to the devices to control a temperature of the devices when said tester performs the testing of the devices; and a plurality of air nozzles being mounted on said push plate, said air nozzles guiding the air from said air providing unit to the devices, at least one of said air nozzles comprising:
  an outer tube being mounted to said push plate, said outer tube having a first end facing toward said fixed block and a second end facing toward said base plate; and
  a nozzle tube being movably installed at least partly inside said outer tube;

when said push plate is moved away from the test tray and toward said base plate, and when said nozzle tube is not contacting the devices and is not contacting the test tray, said nozzle tube extending a first distance out from the first end of said outer tube;

when said push plate is moved toward the test tray and away from said base plate, and when said nozzle tube is contacting at least one selected from among the test tray and at least one of the devices, said nozzle tube not extending the first distance out from the first end of said outer tube.

14. The apparatus of claim 13, the devices corresponding to semiconductor devices.

15. The apparatus of claim 13, said outer tube at least partly penetrating said push plate when said outer tube is mounted to said push plate.

16. The apparatus of claim 15, said air providing unit comprising:
  an air duct being secured to said base plate at a location between said push plate and said base plate; and
  a plurality of communication vessels protruding from said air duct, said vessels providing air from said air providing unit to said air nozzles, each respective communication vessel extending into a respective one of said air nozzles.

17. The apparatus of claim 16, further comprising a plurality of guide pins being located between said fixed block and said base plate, said guide pins penetrating said push plate and guiding said push plate toward and away from said fixed block.

18. The apparatus of claim 17, further comprising at least one position determining pin mounted on said push plate on a side of said push plate facing toward said fixed block, said at least one position determining pin aligning said push plate with the test tray when said push plate is moved toward the test tray by said movable unit.

19. The apparatus of claim 18, each one of said air nozzles comprising:
  a spring being installed inside said outer tube near the second end of said outer tube, said spring pushing said nozzle tube toward said fixed block.

20. The apparatus of claim 19, each of said vessels extending into the second end of said outer tube and into said nozzle tube.

21. The apparatus of claim 13, the first side of said fixed block being opposite to the second side of said fixed block.

22. A method for testing devices, comprising:
  receiving a test tray into a fixed block, the test tray having at least one device;
  positioning a tester at a first side of the fixed block, the tester testing the at least one device when the test tray is received by the fixed block;
  moving a push plate toward a second side of the fixed block and away from the second side of the fixed block; and
  guiding gas directly toward at least one selected from among the test tray and the at least one device to control an environment of the at least one device, said guiding being performed by at least one air nozzle mounted on the push plate, the at least one air nozzle including a nozzle tube and including an outer tube mounted to the push plate, the outer tube forming an opening facing toward the test tray, the nozzle tube penetrating the opening formed by the outer tube and being partly inside the outer tube and partly outside the outer tube, the guided gas flowing through the inner and outer tubes, the nozzle tube being supported by an elastic force urging the nozzle tube away from the push plate.

23. The method of claim 22, further comprising:
  when the nozzle tube is not contacting the at least one device and is not contacting the test tray, pushing the nozzle tube to extend a first distance out away from the opening formed by said outer tube; and
  when said nozzle tube is contacting at least one selected from among the test tray and the at least one device, pushing the nozzle tube to extend less than the first distance out away from the opening formed by said outer tube and to direct the gas directly toward the at least one selected from among the test tray and the at least one device, said pushing corresponding to the elastic force urging the nozzle tube away from the push plate.

24. The method of claim 23, said guiding of the gas toward at least one selected from among the test tray and the at least one device controlling a temperature of the at least one device.

25. The method of claim 24, further comprising:
  controlling a temperature of the gas; and
  providing the gas having the controlled temperature to the at least one air nozzle, said providing being performed by a duct and at least one communication vessel connected to the duct, the at least one vessel guiding the gas to the at least one air nozzle and extending into the at least one air nozzle.

26. The method of claim 25, the first side of the fixed block being opposite to the second side of the fixed block.

27. The method of claim 26, said pushing being provided by a spring installed inside the outer tube, the at least one vessel being extended into the outer tube and into the nozzle tube.

* * * * *